(12) United States Patent
Cui et al.

(10) Patent No.: US 8,963,532 B2
(45) Date of Patent: Feb. 24, 2015

(54) REFERENCE CURRENT DISTRIBUTION

(71) Applicant: Micron Technology, Inc., Boise, ID (US)

(72) Inventors: Mingdong Cui, Shanghai (CN); Xinwei Guo, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/222,861

(22) Filed: Mar. 24, 2014

(65) Prior Publication Data
US 2014/0204688 A1    Jul. 24, 2014

Related U.S. Application Data

(63) Continuation of application No. 13/170,029, filed on Jun. 27, 2011, now Pat. No. 8,698,480.

(51) Int. Cl.
G05F 1/10     (2006.01)
G11C 13/00    (2006.01)
G11C 7/14     (2006.01)

(52) U.S. Cl.
CPC ............... *G11C 13/004* (2013.01); *G11C 7/14* (2013.01)
USPC .......................................... 323/315; 327/540

(58) Field of Classification Search
USPC .......................................... 327/540; 323/315
See application file for complete search history.

(56) References Cited

U.S. PATENT DOCUMENTS

| | | | |
|---|---|---|---|
| 5,479,132 A | 12/1995 | Verhaeghe | |
| 5,550,503 A | 8/1996 | Garrity | |
| 6,201,380 B1 | 3/2001 | Tsujino et al. | |
| 6,525,978 B2 * | 2/2003 | Weber et al. | 365/207 |
| 6,528,981 B1 | 3/2003 | Tsubaki | |
| 6,657,422 B2 | 12/2003 | Heyne | |
| 6,798,245 B2 | 9/2004 | Ohmae | |
| 6,924,601 B2 | 8/2005 | Date | |
| 7,123,509 B2 * | 10/2006 | Ohsawa | 365/184 |
| 7,135,928 B2 | 11/2006 | Behzad | |
| 7,238,925 B2 | 7/2007 | Purcell et al. | |
| 7,498,883 B2 | 3/2009 | Wu | |
| 7,535,783 B2 | 5/2009 | DeBrosse et al. | |
| 7,569,883 B2 | 8/2009 | Frisina et al. | |
| 7,659,500 B2 | 2/2010 | Purcell | |
| 7,675,442 B2 * | 3/2010 | Kuttner | 341/136 |
| 7,817,149 B2 | 10/2010 | Tsuge | |
| 7,875,936 B2 | 1/2011 | Magri et al. | |
| 7,903,478 B1 | 3/2011 | Sforzin et al. | |
| 7,915,915 B1 | 3/2011 | Kuzmenka | |
| 8,310,420 B2 * | 11/2012 | Kwon et al. | 345/82 |
| 8,363,365 B2 | 1/2013 | Fukuoka et al. | |
| 8,503,247 B2 * | 8/2013 | Yoshioka | 365/185.23 |
| 8,519,694 B2 * | 8/2013 | Berkhout | 323/315 |
| 8,698,480 B2 * | 4/2014 | Cui et al. | 323/315 |
| 2007/0252213 A1 | 11/2007 | Hirose | |
| 2007/0290280 A1 | 12/2007 | Kwon | |

(Continued)

FOREIGN PATENT DOCUMENTS

KR    20090025495    3/2009

*Primary Examiner* — Thomas J Hiltunen

(74) *Attorney, Agent, or Firm* — Dorsey & Whitney LLP

(57) ABSTRACT

Example reference current distribution circuitry described herein include current mirrors having resistive elements of varying sizes between gate nodes of sense amplifier transistors along a voltage distribution line. Examples of counter coupling capacitances which may be coupled to the gate nodes of sense amplifier transistors are also described.

20 Claims, 4 Drawing Sheets

(56) References Cited

U.S. PATENT DOCUMENTS

| 2010/0214821 | A1 | 8/2010 | Taylor et al. |
| 2010/0279645 | A1 | 11/2010 | Scott et al. |
| 2011/0085375 | A1 | 4/2011 | Taylor et al. |
| 2011/0181340 | A1 | 7/2011 | Gazit |
| 2012/0200359 | A1 | 8/2012 | Karthaus |
| 2012/0326765 | A1 | 12/2012 | Cui et al. |

* cited by examiner

REFERENCE CURRENT DISTRIBUTION

CROSS REFERENCE TO RELATED APPLICATION(S)

This application is a continuation of pending U.S. patent application Ser. No. 13/170,029, filed Jun. 27, 2011, which application is incorporated herein by reference, in its entirety, for any purpose.

TECHNICAL FIELD

Embodiments of the invention relate generally to memory, and particularly, examples described herein include current mirrors and methods for current monitoring.

BACKGROUND

Memory devices may be provided as integrated circuits in computers or other electronic devices. There are many different types of memory devices, and memory devices may generally be volatile or non-volatile. Volatile memory may require power to maintain information stored therein, while non-volatile memory may not lose the stored information in the absence of power. Examples of volatile memory include DRAM and SDRAM memory devices. Examples of non-volatile memory include ROM, flash memory, and resistance variable memory. With increasing popularity of electronic devices, such as laptop computers, portable digital assistants, digital cameras, mobile phones, digital audio players, video game consoles and the like, demand for nonvolatile memories are considered to be on the rise.

Examples of resistance variable memory, a type of non-volatile memory, include phase change memory (PCM) devices. A phase change memory cell layout may resemble that of a DRAM memory cell, with the DRAM capacitance being replaced by a phase change material, such as Germanium-Antimony-Telluride (GST). The phase change material, e.g. GST, may exist in two states—an amorphous, high resistance state, or a crystalline, low resistance state. The resistance state of the material may be altered by applying current pulses to the cell, for example by heating the material with a programming current to result. In this manner, a PCM memory cell may be programmed to a particular resistance state through use of a programming current. In some examples, the amorphous, high resistance state of the material in the memory cell may correspond to a logic state of 1, while the crystalline, low resistance state of the material in the memory cell may correspond to a logic state of 0. In other examples, the opposite logic assignments may be used.

The programmed resistance state of a PCM cell may be determined by sensing a current and/or voltage associated with the cell. During a sensing operation, e.g. a read operation, a sensed voltage and/or current associated with the PCM cell may be compared with one or more reference voltages and/or currents to determine the particular state of the PCM cell.

DETAILED DESCRIPTION

Described examples below include circuits and methods for providing a reference current signal to sense amplifiers for memory cells. The reference current signal may be provided to or otherwise utilized by sense circuitry to read data stored in the memory cells. Certain details are set forth below to provide a sufficient understanding of embodiments of the invention. However, it will be clear to one skilled in the art that embodiments of the invention may be practiced without various of the particular details. In some instances, well-known circuits, control signals, timing protocols, materials, and software operations have not been shown in detail in order to avoid unnecessarily obscuring the described embodiments of the invention.

As was generally described above, a state of a memory cell may be sensed (e.g. read) by comparing a current or voltage associated with the memory cell to a reference current and/or voltage. In some examples, a current associated with a memory cell, such as a phase change memory cell, may be compared with a reference current. Example memory devices may include a large number of memory cells and associated sense amplifiers, 256 sense amplifiers in some examples. The sense amplifiers may be configured to perform the comparison between memory cell current and reference current. The sense amplifiers may be distributed across a physical die area. For accurate sensing, it may be desirable to provide an accurate reference current to these multiple sense amplifiers located across the physical die area. Across this physical die area, the power supply voltages, such as the ground supply, may vary, which may cause variation in the reference current. Moreover, it may be desirable for the reference current to be unaffected or minimally affected by noise generated by sensing circuits turning on and off during operation. If the reference current varies over time or across memory cells, inaccurate sensing could result. Examples described below may facilitate the provision of an accurate reference current to sensing circuits. Examples of sensing circuits include sense amplifiers. Examples of sensing circuits may include one or more transistors, which may be referred to herein as a sensing transistors, current mirroring transistors, and/or sense amplifier transistors.

Figure 1:
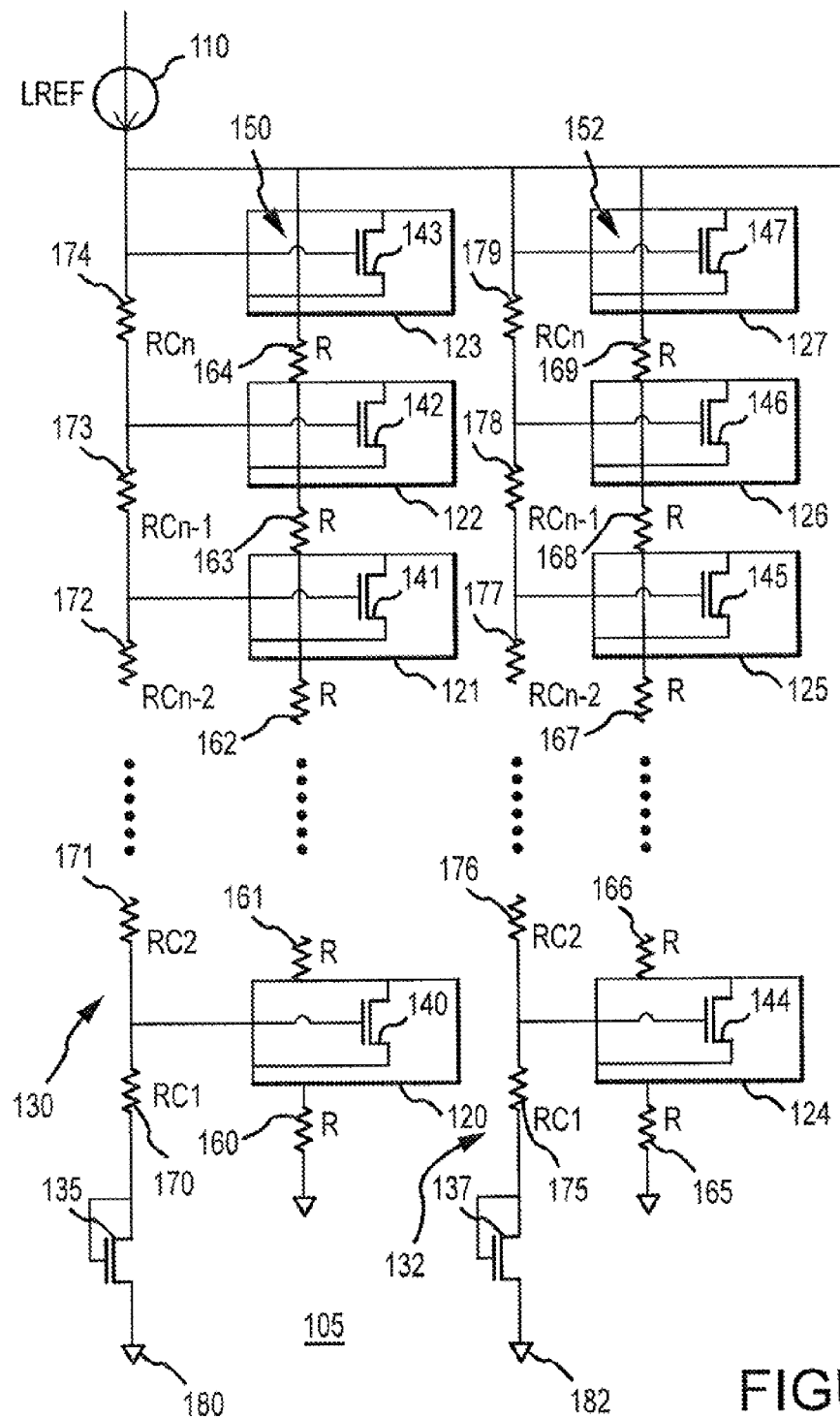
FIG. 1 is a schematic illustration of reference current distribution circuitry in accordance with an embodiment of the present invention.

FIG. 1 is a schematic illustration of reference current distribution circuitry in accordance with an embodiment of the present invention. The reference current distribution circuitry 105 includes a reference current source 110. Any suitable current source circuitry may be used to implement the reference current source 110. The reference current distribution circuitry 105 of FIG. 1 is configured to provide a current to each of a plurality of sensing circuits, with sense amplifiers 120-127 shown in FIG. 1. Any number of sense amplifiers may be used. The reference current provided to each of the sense amplifiers may be equal to the reference current generated by the current source 110 in some examples, and may be related to the reference current generated by the current source 110 in other examples. As shown in FIG. 1, the sense amplifiers are arranged in accordance with two lines 130, 132. Each of the lines 130, 132 is a conductive line coupled to a respective current mirroring transistor 135, 137. The current mirroring transistor 135 has a source node coupled to ground, and a drain node coupled to the line 130. The line 130 is coupled to the current source 110 and the gate node of a transistor of each of the sense amplifiers 120-123. Similarly, the current mirroring transistor 137 has a source node coupled to ground, and a drain node coupled to the hue 132. The line 132 is coupled to the current source 110 and the gate node of a transistor of each of the sense amplifiers 124-127.

In this manner, the current mirroring transistors 135 and 137 are configured to mirror the reference current generated by the current source 110 to each of the sense amplifiers. Each of the sense amplifiers 120-127 includes a respective sensing transistor (e.g. sense amplifier transistors 140-147) having a gate coupled to the line 130 or the line 132. The sense amplifiers 120-123 are coupled to one another by source line 150. The sense amplifiers 124-127 are coupled to one another by source line 152. The source line 150 is coupled to the source nodes of the transistors 140-143. The source line 152 is coupled to the source nodes of the transistors 144-147.

The source lines 150, 152 couple respective groups of sense amplifiers together through resistive elements 160-169, shown as having a value 'R' in FIG. 1. The resistance 'R' may include, for example, the parasitic resistance attributable to the source line itself. In some cases, the voltage provided by the source lines 150, 152 to the source nodes of the sense amplifier transistors 140-147 may vary. That is, the voltage provided at the source node of one sense amplifier transistor may be different than the voltage provided at the source node of another sense amplifier transistor. This may occur, for example, due to DC current through the sense amplifier transistors, resulting in a voltage drop across one or more of the resistive elements 160-169. This difference in voltage provided to source nodes may disadvantageously effect the reference current provided to the sense amplifiers.

The reference current provided through one of the sense amplifier transistors 140-147 may be theoretically represented by the equation:

$$I_{ref} = \frac{1}{2}\mu_0 C_{ox} \frac{W}{L}(V_{bias} - V_{src} - V_i)^2;$$

where $\mu_0$, $C_{ox}$, W/L, and $V_t$ are properties of the sense amplifier transistor, as understood in the art. The voltage $V_{bias}$ refers to the voltage provided at the gate of the sense amplifier transistor by the line 130 or 132, for example in FIG. 1. The voltage $V_{src}$ refers to the voltage provided at the source of the sense amplifier transistor by the line 150 or 152, as described above. Accordingly, if the $V_{src}$ voltage is different at different sense amplifier transistors, the resultant reference current provided to the sense amplifier will also vary.

Embodiments of the present invention may include resistive elements included in the lines 130 and 132 coupled to the gates of the sense amplifier transistors. As shown in FIG. 1, the resistive elements 170-174 are shown coupled in series along the line 130. The resistive elements 170-174 have respective values as shown in FIG. 1 (RC1, RC2, RCn-2, RCn-1, and RCn). The resistive elements 170-174 may advantageously compensate for differing voltages provided at the source of sense amplifier transistors by providing different voltages at the gates of the sense amplifier transistors. In this manner, the voltage difference $V_{bias}-V_{src}$ be more constant across the various sense amplifier transistors. In particular, the resistive elements 170-174 may be sized such that RC1=R/n where R is the resistance of each of the resistive elements 160-164 in the source line, and n is the number of sense amplifiers coupled to the line 130. RC2 may be sized such that RC2=R/(n-1). RC3 (not shown in FIG. 1) may be sized such that RC3=R/(n-3), and so on. The resistive element 174 may be sized such that RCn=R. In an analogous manner, resistive elements 175-179 are provided along the line 132.

Also shown in FIG. 1, the ground node coupled to the lines 130, 132 for distributing a voltage to the gate nodes of the sense amplifier transistors, is a same ground node used by the current source 110 to generate the reference current. That is, for example, the current mirror transistor 135 is coupled to the ground node 180, which ground node is also coupled to the current source 110 through the line 130. Similarly, the current mirror transistor 137 is coupled to the ground node 182 which is also coupled to the current source 110 through the line 132. In this manner, noise on the ground node 180 and 182 may similarly effect the current source 110 and the distribution of voltage to the gate nodes of the sense amplifier transistors. Accordingly, the effect of noise at the ground nodes 180, 182 may be minimized because, although the noise may cause a variation in the voltage provided to the sense amplifier transistor gates, it may also cause a variation in the reference current used to generate that voltage.

As described above, embodiments of the present invention provide a voltage based on a reference current to the gate nodes of sense amplifier transistors using one or more lines. The lines may include resistive elements which increase in resistance the further they are located from a reference (e.g., ground) node. In this manner, the voltage provided to the gate node of sense amplifier transistors furthest from the reference (e.g., ground) node may be greater than the voltage provided to the gate node of sense amplifier transistors closer to the ground node. This may provide compensation for the difference in voltages at the source nodes of the sense amplifier transistors. As described above, the voltage provided at the source nodes of the sense amplifier transistors may be greater for the sense amplifier transistors farther from the reference (e.g., ground) node than for source nodes of the sense amplifier transistors closer to the reference (e.g., ground) node. This may result, for example, from DC current through the source line connecting the sense amplifier transistors. By similarly varying the voltage provided to the gates of the sense amplifier transistors, the difference between the gate and source node voltages may be more constant among the sense amplifier transistors. Of course, the advantages described herein are provided by way of explanation to facilitate understanding of embodiments of the invention. It is to be understood that not all embodiments may provide all, or even any, of the described advantages.

As generally described above, resistive elements of varying sizes may be used between gate nodes of sense amplifiers along a voltage distribution line. Although the resistive elements in FIG. 1 were shown as differing between each of the sense amplifiers, in other embodiments some of the sense amplifiers may be connected by resistive elements having a same value. That is, the resistance along the voltage distribution line need not change uniformly between sense amplifiers in some embodiments.

Figure 2:
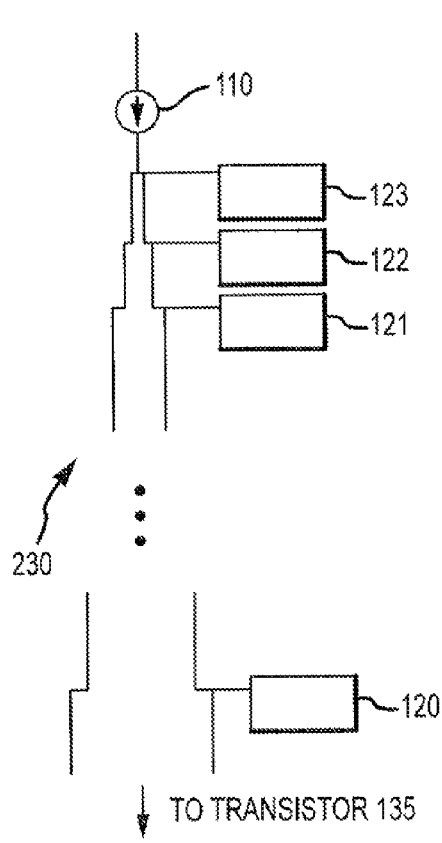
FIG. 2 is a schematic illustration of a conductive line in accordance with an embodiment of the present invention.

The resistive elements may generally be implemented using any resistive structure. In some examples, the resistive elements may be implemented using differing widths of a conductive line. Generally, the resistance of a portion of the conductive line may be proportional to the inverse of the width of the portion of the line. FIG. 2 is a schematic illustration of a conductive line in accordance with an embodiment of the present invention. The conductive line 230 may, for example, be used to implement the line 130, 132, or both, of FIG. 1. As shown in FIG. 2, the conductive line 230 has an increasing width, with the line having a larger width closer to the ground node, and a smaller width closer to the current source 110. The sense amplifiers 120, 121, 122, and 123 are shown in FIG. 2 and intersect the line 230. The width of portions of the line 230 may be selected such that the resistance of the portions have the resistances described above with reference to the resistive elements 170-174.

Figure 3:
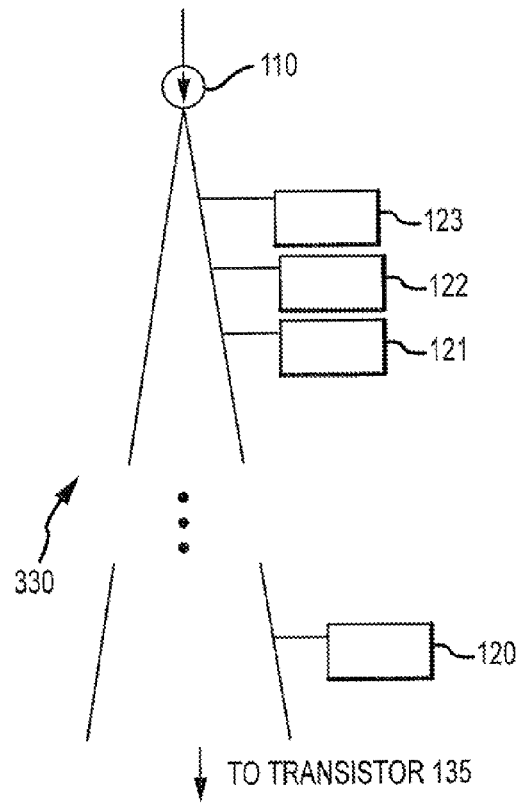
FIG. 3 is a schematic illustration of another conductive line in accordance with an embodiment of the present invention.

Other configurations may also be used to implement resistive elements. FIG. 3 is a schematic illustration of another conductive line in accordance with an embodiment of the present invention. The line 330 has a smoothly increasing width as it is viewed from the current source 110 to the ground node (not shown in FIG. 3). The source amplifiers 120, 121, 122, and 123 are shown in FIG. 3 and intersect the line 330. The rate of increase in width of the line 330 may be selected such that the resistance of the portions have the resistances described above with reference to the resistive elements 170-174.

Accordingly, examples of reference current distribution circuitry have been described above which may include one or more lines having varying resistance along the line. The lines having varying resistance may be used to couple together a current mirroring transistor with individual transistors of a plurality of sense amplifiers. Examples of lines which may be used include lines having a continuously or step-wise increasing width along the line.

Another situation that may occur when operating sense amplifiers is that the sense amplifier transistors used to provide the reference current to the sense amplifiers (the transistors 140-147 of FIG. 1, for example) may turn on and off at different times or rates. Turning off one or a sufficient number of the sense amplifier transistors may cause the voltage at the drain node of the sense amplifier transistor to change, and the change in voltage of the drain node may be coupled through to the gate node. Once the gate node voltage changes, the gate voltage of other sense amplifier transistors may also change, since they may be coupled together. The change in the gate voltage may therefore result in a change in reference current provided to the sense amplifier. That is, turning off one or more sense amplifier transistors may cause the reference current generated at other sense amplifiers to change. To reduce this effect, a decoupling capacitance may be coupled to the gate nodes of the sense amplifier transistors. However, in some embodiments the size of the required decoupling capacitance may be disadvantageous due to the size of the capacitance or for other reasons. Embodiments of the present invention may provide a counter coupling capacitance which may be coupled to the gate nodes of the sense amplifier transistors. As described further below, an appropriately-sized counter coupling capacitance may be used to reduce the amount of variation at the gate nodes caused by on and off switching of the sense amplifier transistors.

Figure 4:
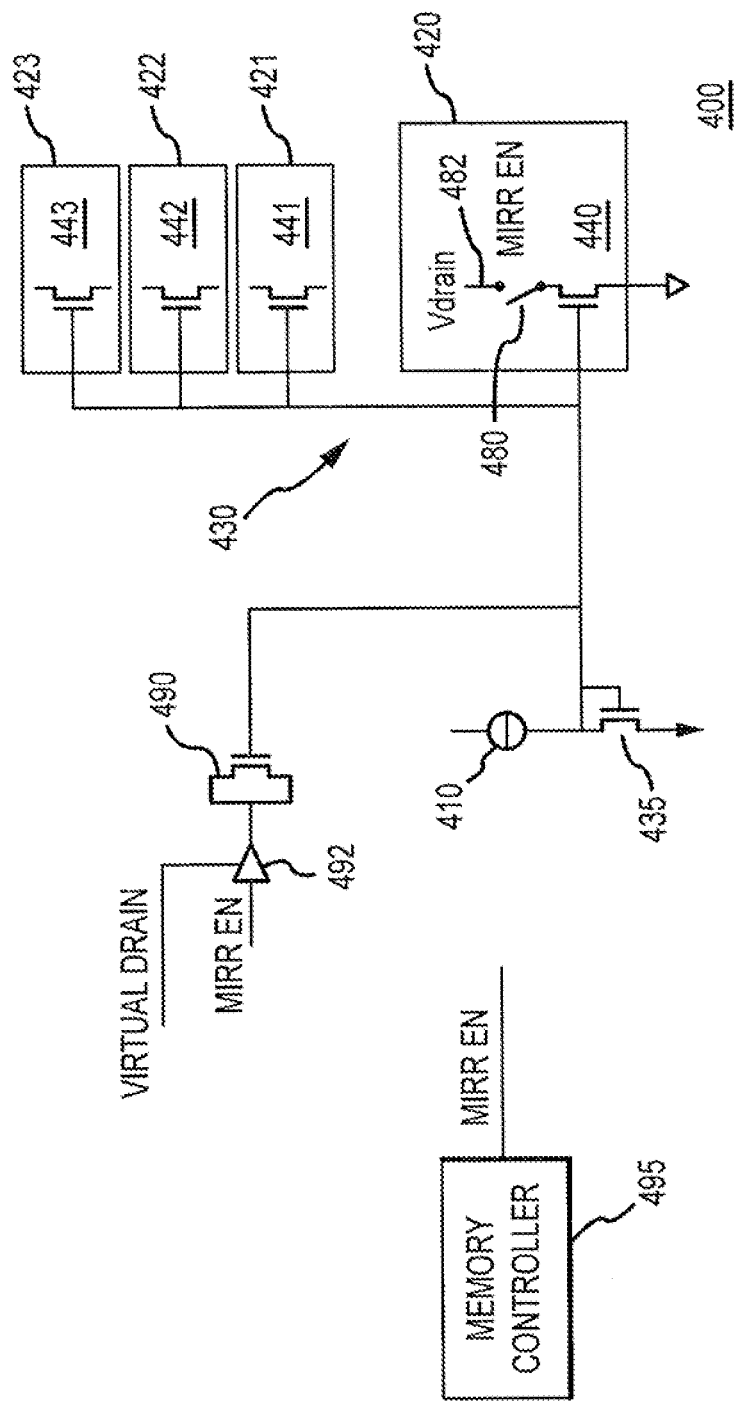
FIG. 4 is a schematic illustration of a portion of reference current distribution circuitry including a counter coupling capacitance in accordance with an embodiment of the present invention.

FIG. 4 is a schematic illustration of a portion of reference current distribution circuitry including a counter coupling capacitance in accordance with an embodiment of the present invention. The reference current distribution circuitry 400 includes a current source 410 and a current mirror transistor 435 coupled between the current source 410 and a ground node. The reference current distribution circuitry 400 also includes a plurality of sensing circuit (e.g. sense amplifiers 420-423), each of which includes a respective sensing transistor (e.g. sense amplifier transistors 440-443). The sense amplifier transistors 440-443 have their respective gate nodes coupled to a common conductive line 430. The conductive line 430 may utilize resistance elements of varying resistance, as has been described above. Each of the sense amplifier transistors may be coupled to a drain node Vdrain by a switch. The switches and drain nodes are not all shown in FIG. 4, but the switch 480 and drain node 482 is shown for the sense amplifier 420.

Without being limited by theory, a capacitance $C_{gd}$ may exist between each of the sense amplifier transistors' gate and drain nodes. When a sense amplifier transistor is turned on, such as by receipt of a control signal, e.g. a mirror enable signal Mirr En shown in FIG. 4, the drain node of the transistor may be raised to a higher voltage, which in some embodiments may be 1 or 1.2 V. Charge may then be coupled to the gate node and the conductive line 430 through the capacitance $C_{gd}$. As described generally above, this may disrupt the reference current provided to the sense amplifiers. Accordingly, the reference current distribution circuitry 400 includes a counter coupling capacitance 490 having one node coupled to the line 430. The other node of the counter-coupling capacitance 490 is coupled to an inverter 492 configured to provide an inverted version of the control signal used to turn on the sense amplifier transistors, e.g. Mirr En. The inverter 492 is powered by a virtual drain such that when providing an active signal, a voltage equal to the anticipated drain node voltage of the sense amplifier transistors is provided to the capacitance 490. In this manner, when the sense amplifier transistors 440-443 are on and sensing, the capacitance 490 is connected between the line 430 and a voltage approximately equal to the drain node voltage. Accordingly, excess charge coupled to the line 430 through the $C_{gd}$ of the sense amplifier transistors may be stored on the capacitance 490 and may not effect or have a lesser effect on the voltage of the line 430 itself. When the sense amplifier transistors are not sensing, the voltage at the sense amplifier transistors' drain may drop and couple a negative charge to the line 430. The capacitance 490 may also aid in compensating for this negative charge coupled to the line 430 by releasing charge to the line 430 to compensate for the negative charge coupled from one or more sense amplifier transistors. The control signal, e.g. Mirr En, may be generated by a memory controller 495. Both the rising and the falling edge of the control signal may be designed for adequate charge compensation.

The size of the capacitance 490 may be selected to accommodate an adequate amount of charge that may be coupled to the line 430 from the sense amplifier transistors 440-443. The size of the capacitance 490 may be written as $C_{counter-coupling}$, where $$C_{counter-coupling} = C_{gd} * (\text{number\_of\_sense\_amplifiers})$$

Where $C_{gd}$ is the capacitance between the gate and drain nodes of one of the sense amplifier transistors, and number_of_sense_amplifiers refers to the number of sense amplifier transistors coupled to the line 430 in FIG. 4. In this manner, the counter coupling capacitance 490 may be able to mitigate all or most of the charge added to the line 430 by the sense amplifier transistors. In FIG. 4, the capacitance 490 is shown implemented as a transistor having its source and drain nodes tied together. In other embodiments, other capacitance implementations may be used.

Accordingly, embodiments of a counter coupling capacitance have been described for use with reference current distribution circuitry. By coupling the counter coupling capacitance to the gate nodes of the sense amplifier transistors when the sense amplifiers are sensing, the voltage at the gate nodes may be stabilized during operation of the sense amplifiers.

Figure 5:
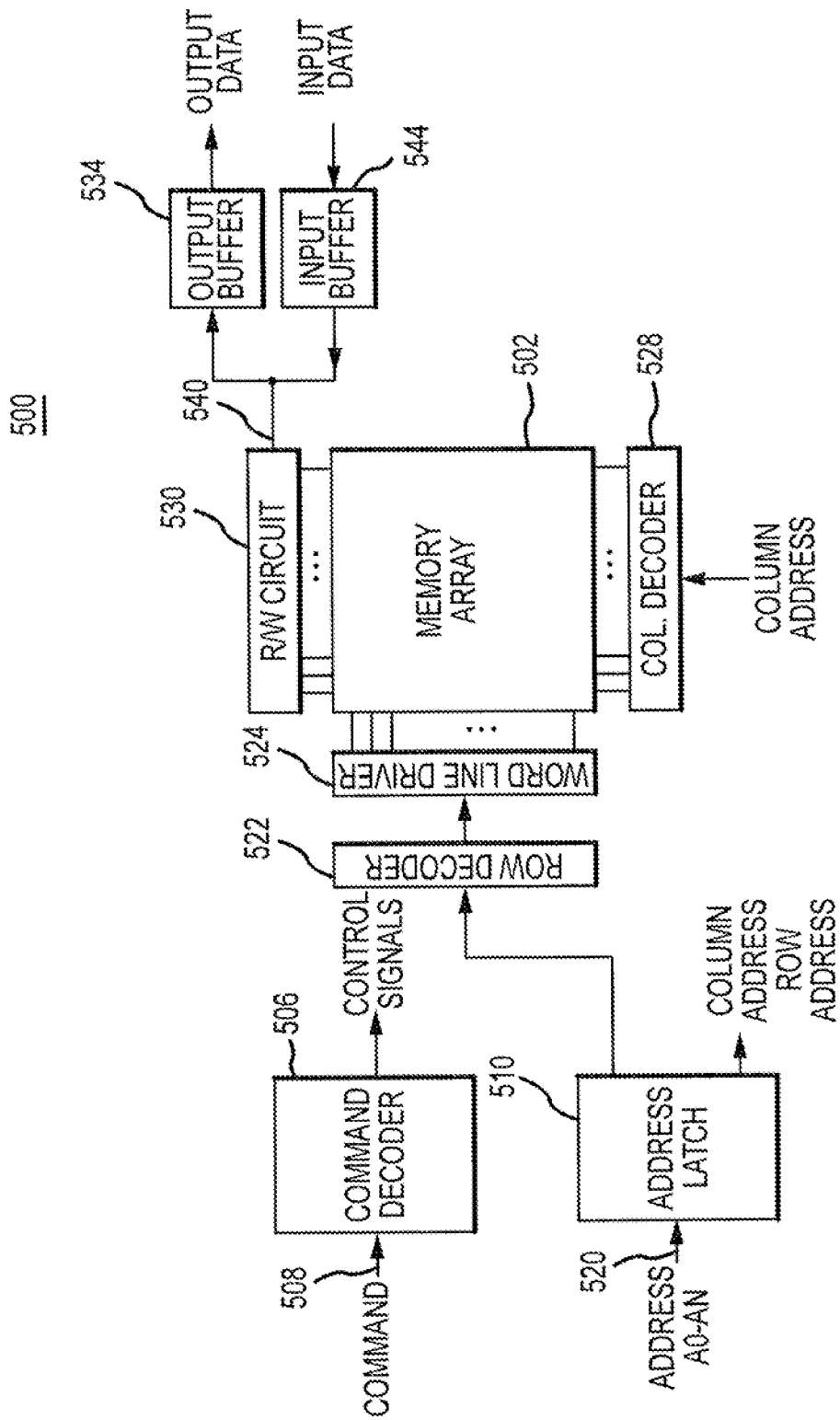
FIG. 5 is a schematic illustration of a portion of a memory device according to an embodiment of the present invention.

FIG. 5 is a schematic illustration of a portion of a memory device according to an embodiment of the present invention. The memory 500 includes an array 502 of memory cells, which may be, for example, phase change memory cells, DRAM memory cells, SRAM memory cells, flash memory cells, or some other type of memory cells. The memory system 500 includes a command decoder 506 that may receive memory commands through a command bus 508 and generate corresponding control signals within the memory system 500 to carry out various memory operations. The command decoder 506 may respond to memory commands applied to the command bus 508 to perform various operations on the memory array 502. For example, the command decoder 506 may be used to generate internal control signals to read data from and write data to the memory array 502. Row and column address signals may be applied to the memory system 500 through an address bus 520 and provided to an address latch 510. The address latch may then output a separate column address and a separate row address.

The row and column addresses may be provided by the address latch 510 to a row address decoder 522 and a column address decoder 528, respectively. The column address decoder 528 may select bit lines extending through the array 502 corresponding to respective column addresses. The row address decoder 522 may be connected to word line driver 524 that may activate respective rows of memory cells in the array 502 corresponding to received row addresses. The selected data line (e.g., a bit line or bit lines) corresponding to a received column address may be coupled to read/write circuitry 530 to provide read data to a data output buffer 534 via an input-output data bus 540. Write data may be applied to the memory array 502 through a data input buffer 544 and the memory array read/write circuitry 530. Examples of the sense amplifiers and reference current distribution circuitry described above may be utilized as a portion of the read/write circuitry 530.

The memory device shown in FIG. 5 may be implemented in any of a variety of products employing processors and memory including for example cameras, phones, wireless devices, displays, chip sets, set top boxes, gaming systems, vehicles, and appliances. Resulting devices employing the memory system may benefit from the embodiments of a command latency system described above to perform their ultimate user function.

From the foregoing it will be appreciated that, although specific embodiments of the invention have been described herein for purposes of illustration, various modifications may be made without deviating from the spirit and scope of the invention.

What is claimed is:

1. An apparatus, comprising:
a conductive line including a resistance value which varies along a length of the conductive line;
a plurality of sensing circuits coupled to the conductive line, each of the plurality of sensing circuits including a respective sensing transistor and a respective switch coupled to a drain of the respective sensing transistor and wherein the respective switch is configured to switch in accordance with a control signal; and
a capacitance including a first node coupled to the gate of the respective sensing transistors of each of the plurality of sensing circuits and further including a second node coupled to an inverter, wherein the inverter is configured to receive the control signal and to provide an inverted control signal to the second node of the capacitance.

2. The apparatus of claim 1, wherein the inverted control signal provided by the inverter to the second node of the capacitance varies the capacitance value of the capacitance based on a number of the plurality of sensing circuits enabled.

3. The apparatus of claim 2, wherein the inverter is coupled to a virtual drain and is configured to provide a voltage equal to an anticipated drain node voltage based on a number of the plurality of sensing circuits enabled.

4. The apparatus of claim 1, further comprising a transistor including a gate and a drain coupled to the conductive line.

5. The apparatus of claim 1, wherein the resistance value which varies along a length of the conductive line varies linearly from one end of the length of the conductive line to the other end of the length of the conductive line.

6. The apparatus of claim 1, wherein the resistance value which varies along a length of the conductive line varies step-wise from one end of the length of the conductive line to the other end of the length of the conductive line.

7. The apparatus of claim 1, wherein a difference between a gate voltage and a source voltage of each of the respective sensing transistors of the plurality of sensing circuits remains substantially constant along the length of the conductive line.

8. The apparatus of claim 1, further comprising a reference current generator coupled to the conductive line.

9. An apparatus comprising:
a plurality of sense amplifiers coupled to a source line, each of the plurality of sense amplifiers including a respective sensing transistor and a respective switch coupled to a drain of the respective sensing transistor and wherein the respective switch is configured to switch in accordance with a control signal;
a conductive line coupled to gates of the respective sensing transistors, wherein the conductive line is configured to compensate for different voltages provided by the source line to the plurality of sense amplifiers by providing different voltages at the gates of the respective sensing transistors; and
a counter-coupling capacitance coupled to the conductive line and configured to compensate for changes in charge coupled to the conductive line through the gates of the respective sensing transistors responsive to the control signal.

10. The apparatus of claim 9, wherein a resistance of the conductive line varies along a length of the conductive line from a reference current generator coupled to the conductive line to a reference node.

11. The apparatus of claim 10, wherein the resistance value of the conductive line increases from the reference node to the reference current generator.

12. The apparatus of claim 10, further comprising a current mirror transistor coupled to the conductive line.

13. The apparatus of claim 9, further comprising an inverter coupled to the counter-coupling capacitance, the controlled by the control signal, the inverter configured to provide the counter-coupling capacitance an inverted control signal with a voltage value based on a number of sense amplifiers enabled by the control signal.

14. The apparatus of claim 13, wherein the inverter is coupled to a virtual drain and is configured to provide a voltage equal to an anticipated drain node voltage based on a number of the plurality of sensing circuits enabled.

15. An apparatus, comprising:
a conductive line including resistive elements having resistance values that vary along a length of the conductive line;
a plurality of sensing circuits coupled to the conductive line, each of the plurality sensing circuits including a respective sensing transistor having a gate coupled to the conductive line and further including a switch coupled to a respective source of the respective sensing transistor, wherein the switch is enabled by a control signal;

a capacitance coupled to the conductive line; and
an inverter coupled to the capacitance, wherein the inverter is configured to provide an inverted control signal to the capacitance, wherein a value of the capacitance is responsive to the inverted control signal and is based on a number of sensing circuits enabled by the control signal.

16. The apparatus of claim 15, wherein a width of the conductive line varies along the length of the conductive line to vary the resistance values of the resistive elements.

17. The apparatus of claim 15, wherein the resistance values of the resistive elements increase the farther the respective resistive element is located from the reference node.

18. The apparatus of claim 15, wherein each of the resistive elements has a different resistance value.

19. The apparatus of claim 15, wherein the capacitance is configured to provide an amount of charge substantially equal to and of an opposite polarity to an amount of charge added to the conductive line responsive to the number of sensing circuits enabled by the control signal.

20. The apparatus of claim 15, wherein the inverter is coupled to a virtual drain, wherein the virtual drain is configured to provide a voltage to the capacitive element equal to a drain node voltage of the enabled sensing circuits.

\* \* \* \* \*